United States Patent [19]
Jones et al.

[11] Patent Number: 5,666,055
[45] Date of Patent: Sep. 9, 1997

[54] SURFACE COIL SYSTEM FOR A SINGLE CHANNEL NMR RECEIVER

[76] Inventors: Randall W. Jones, 1025 Chapel Hill Dr., Elkhorn, Nebr. 68022; Fred Davis, 8108 S. 87th St., Apt. #6, LaVista, Nebr. 68128

[21] Appl. No.: 537,534

[22] Filed: Oct. 2, 1995

[51] Int. Cl.⁶ ................................ G01V 3/00
[52] U.S. Cl. .................. 324/318; 324/322; 128/653.5
[58] Field of Search .................. 128/653.2, 653.3; 324/300, 307, 309, 310, 311, 312, 313, 314, 318, 322

[56] References Cited

U.S. PATENT DOCUMENTS

| | | | |
|---|---|---|---|
| 4,752,738 | 6/1988 | Patrick et al. | 324/309 |
| 4,825,162 | 4/1989 | Rosmer et al. | 324/318 |
| 4,924,868 | 5/1990 | Krause et al. | 128/653 SC |
| 5,086,275 | 2/1992 | Roemer | 324/309 |
| 5,097,210 | 3/1992 | Requardt et al. | 324/318 |
| 5,144,243 | 9/1992 | Nakabayashi et al. | 324/318 |
| 5,202,634 | 4/1993 | Potthast et al. | 324/322 |
| 5,430,378 | 7/1995 | Jones | 324/318 |

*Primary Examiner*—Louis M. Arana
*Attorney, Agent, or Firm*—Zarley, McKee, Thomte, Voorhees & Sease; Mark D. Frederiksen

[57] ABSTRACT

A surface coil system for single channel MRI reception comprising a coil system including a plurality of self-resonant, overlapping coil conductor sections arranged relative to one another and to anatomical regions of a patient such that a combination of regions form a desired larger region of interest, a control unit located remotely from the coil system and electromagnetically communicating therewith, having means for selectively electronically activating and deactivating each coil section to produce MRI output signals when activated, means for combining selected MRI output signals, and means for electrically connecting the coil system to an MRI system to transmit selected MRI signals to the MRI system.

20 Claims, 11 Drawing Sheets

SURFACE COIL SYSTEM FOR A SINGLE CHANNEL NMR RECEIVER

TECHNICAL FIELD

The present invention relates generally to magnetic resonance imaging (MRI) and more particularly to local coils and arrays of coils for use in receiving MRI signals.

BACKGROUND OF THE INVENTION

A. Magnetic Resonance Imaging

Magnetic resonance imaging (MRI) refers generally to a form of clinical imaging based upon the principles of nuclear magnetic resonance (NMR). Any nucleus which possesses a magnetic moment will attempt to align itself with the direction of a magnetic field, the quantum alignment being dependent, among other things, upon the strength of the magnetic field and the magnetic moment. In MRI, a uniform magnetic field $B_0$ is applied to an object to be imaged; hence creating a net alignment of the object's nuclei possessing magnetic moments. If the static field $B_0$ is designated as aligned with the z axis of a Cartesian coordinate system, the origin of which is approximately centered within the imaged object, the nuclei which posses magnetic moments precess about the z-axis at their Larmor frequencies according to their gyromagnetic ratio and the strength of the magnetic field.

Water, because of its relative abundance in biological tissues and its relatively strong net magnetic moment $M_z$ created when placed within a strong magnetic field, is of principle concern in MR imaging. Subjecting human tissues to a uniform magnetic field will create such a net magnetic moment from the typically random order of nuclear precession about the z-axis. In a MR imaging sequence, a radio frequency (RF) excitation signal, centered at the Larmor frequency, irradiates the tissue with a vector polarization which is orthogonal to the polarization of $B_0$. Continuing our Cartesian coordinate example, the static field is labeled $B_z$ while the perpendicular excitation field $B_1$ is labeled $B_{xy}$. $B_{xy}$ is of sufficient amplitude and duration in time, or of sufficient power to nutate (or tip) the net magnetic moment into the transverse (x-y) plane giving rise to $M_{xy}$. This transverse magnetic moment begins to collapse and re-align with the static magnetic field immediately after termination of the excitation field $B_1$. Energy gained during the excitation cycle is lost by the nuclei as they re-align themselves with $B_0$ during the collapse of the rotating transverse magnetic moment $M_{xy}$.

The energy is propagated as an electromagnetic wave which induces a sinusoidal signal voltage across discontinuities in closed-loop receiving coils. This represents the NMR signal which is sensed by the RF coil and recorded by the MRI system. A slice image is derived from the reconstruction of these spatially-encoded signals using well known digital image processing techniques.

B. Local Coils and Arrays

The diagnostic quality or resolution of the image is dependent, in part, upon the sensitivity and homogeneity of the receiving coil to the weak NMR signal. RF coils, described as "local coils" may be described as resonant antennas, in part, because of their property of signal sensitivity being inversely related to the distance from the source. For this reason, it is important to place the coils as close to the anatomical region-of-interest (ROI) as possible.

Whereas "whole body" MRI scanners are sufficiently large to receive and image any potion of the entire human body, local coils are smaller and therefore electromagnetically couple to less tissue. Coupling to less tissue gives rise to coupling to less "noise" or unwanted biologically or thermally generated random signals which superimpose upon the desired MR signal. The local coils may be of higher quality factor (Q) than the body coils due to their smaller size. For all of these reasons, local coils typically yield a higher signal-to-noise S/N ratio than that obtainable using the larger whole body antenna. The larger antenna is commonly used to produce the highly homogenous or uniform excitation field throughout the ROI, whereas the local coil is placed near the immediate area of interest to receive the NMR signal. The importance of accurate positioning leads to the development of local coils which conform to the anatomy of interest, yet function to permit ease of use.

While the smaller local coil's size works to an advantage in obtaining a higher S/N ratio, this reduced size also presents a disadvantage for imaging deep-seated tissues. Typically, the single-conductor coil diameter which yields the optimal S/N ratio at a depth 'd' is a coil of diameter 'd'; hence, larger diameter single-conductor coils are required to image regions in the abdomen and chest of human patients. This increased coil size results in less than desirable performance, both in terms of S/N ratio and homogeneity of the sensitivity profile (which effects the uniform brightness of the image), and offers little advantage over the body coil of the system.

The S/N ratio of the NMR signal may be further increased by orienting two coils, or coil pairs about the imaged object so that each detects RF energy along one of a pair of mutually perpendicular axes. This technique is generally known as quadrature detection and the signals collected are termed quadrature signals.

The outputs of the quadrature coils are combined so as to increase the strength of the received signal according to the simple sum of the output signals from the coils. The strength of the noise component of these signals, however, will increase only according to the square root of the sum of the squares of the uncorrelated noise components. As a result, the net S/N ratio of the combined quadrature signals increases by approximately $\sqrt{2}$ over the S/N ratio of the individual coils.

The quadrature orientation of the two coils introduces a 90° phase difference between the NMR signals detected by these coils. Therefore, combining the outputs from the two quadrature coils to achieve the above described signal-to-noise ratio improvements requires that one signal be shifted to have the same phase as the other signal so that the amplitudes of the signals simply add in phase.

The approximate net gain of $\sqrt{2}$ in S/N ratio is achievable primarily due to the lack of inductive coupling between the coil pairs. This ensures that only the uncorrelated noise components add, in lieu of both the uncorrelated and correlated noise components, to reduce the effective S/N ratio. Inductive isolation is achieved by geometrically orienting the coil conductors $$M = \frac{1}{2\pi} \oint \frac{I_1(\overline{dl_1}) \cdot I_2(\overline{dl_2})}{|(\overline{r_1}) - (\overline{r_2})|}$$

such that the mutual inductance is minimized between the coil pairs according to the following: where M represents the mutual inductance between coils 1 and 2 and the vector components $dl_1$ and $dl_2$, represent segments of coils 1 and 2 with current amplitudes $I_1$ and $I_2$. The denominator represents the magnitude difference of the position vectors of each dl segment. The condition wherein M is approximately zero with respect to the individual self inductances of coils 1 and 2, is known as inductive isolation between the coils.

Single versus Multiple Channel Receiver/Coil Systems

A method of increasing the S/N ratio of the NMR signal over a larger region is to digitally add the post processed signals derived from more than one coil; each sensitive to the precessing nuclei within overlapping volumes. If two coils' signals are processed and converted into image data separately and then added digitally, one can obtain an increase in S/N ratio within the larger volume. Separate amplifiers, analog-to-digital converters, sample-and-hold circuits, computer storage, and image processor channels represent an alternative configuration for processing the two signals in lieu of a single quadrature combiner. A system of four channels whose signals are derived from an array of four coils is described in U.S. Pat. No. 4,825,162. The primary advantage of this system is that one obtains the signal-to-noise performance of smaller surface coils over a larger geometric region corresponding to increased anatomical coverage. The disadvantages are the cost and down-time required for additional hardware installation.

A lower cost alternative for multiple channel systems is to utilize switchable field-of-view (FOV) coils, or coil systems comprised of several resonant coil elements which can be electronically selected by the NMR system operator. The operator selects the coil element(s) for resonance which correspond to the region of anatomical interest to be imaged. Those coil elements geometrically situated beyond the region of interest are deselected or unused during the image acquisition; hence contributing no signal or noise to the NMR image.

Prior Art—Switchable FOV Coils

The method of element selection and electronic configuration of these switchable FOV coil systems vary in the prior art. U.S. Pat. Nos. 4,924,868, 5,097,210, and 5,202,634 describe variations in the following design. This design comprises two longitudinal conductors and several transverse conductors for interconnecting the longitudinal conductors, and a coupling device for connection to the RF receiver. This coil geometry lies in a single common plane whereby the size and or position of the active or resonant coil section is changed via opening or closing a RF switch situated in series with each of several transverse conductors within the coil assembly (FIG. 1). These switches are exemplified as PIN diodes but are also referred to as possible mechanical switches. Larger resonant sections are achieved by activation of more distant (further spaced-apart) transverse conductor sections; hence creating larger Regions-of-Sensitivity (ROSs). This type of design requires matching and tuning for patient load variation and for each time the coil configuration is changed. This increases design complexity as well as the time required for set-up and operation. More importantly, activating a larger coil decreases the signal-to-noise (SNR) performance of the coil system, as the larger the coil, the more noise is coupled into the NMR signal generated by the coil. Coupling this coil system to the MRI system is accomplished by way of impedance matching the variable sized (or positioned) coil to the system transmission line which connects to the input to the RF preamplifier. One of the two longitudinal conductors therein forms a part of a coupling device for connecting the surface coil to the RF receiver. Finally, this coil system only operates with MRI systems which contain the requisite hardwired control signals at a convenient interface point between the coil system and the MRI system.

A system of non-overlapping coils with independent transverse elements (such that resonant structures are separate and unique) is detailed in U.S. Pat No. 5,144,243. This system of independent coil loops lying in a common plane requires neutralizing circuitry to compensate for inductive coupling between adjacent pairs of loops (FIG. 2). It is also claimed that due to the amplifiers, the "variations in the resonant state of each coil element and the interference between coil elements can be suppressed by variations in loads imposed on the coil elements". The individual coil elements' outputs are impedance matched before addition in an undefined adder circuit. The multiple inputs and single output could operate with only severe restrictions. A homogeneous sensitivity profile is desired, if not necessary, in MRI. If one attempts to add signals from two or more self-resonant coil elements, particular attention to the phase of the element's signal outputs is required, or the addition process will result in subtraction, and voids in the image profile. There is no mention of phase control, only impedance matching. These two processes often are counter opposing in reduction to practice, in that the phase is seldom correct while the impedance is optimally adjusted, and vice versa. Hence signal losses, via impedance mismatches or improper phase adjustments should be prevalent with this design. Additional disadvantages to this design exist. One is that the non-overlapping coil system will yield non-uniform sensitivity profiles (and inhomogeneous clinical images) with very weak spots occurring in conjunction with the areas between the coils. Also, this design utilizes a series of linear coils or coils sensitive to one of two vector components of the complex NMR signal vector. Quadrature detection coils would yield an effective SNR improvement if they were implemented.

All of the prior art have in common the requirement of a set of hard-wired control signals connecting the NMR system to the switchable coil system. NMR systems would then require such hardware installation for such a coil system to operate. A larger majority of the existing systems do not have such a control system in place.

SUMMARY OF THE INVENTION

It is therefore the object of the present invention to provide a RF coil system for use in magnetic resonance imaging which facilitates highly-sensitive and homogeneous imaging of various anatomical regions of the body without moving the patient or coil. A further object of the invention is to provide for a remotely controlled coil system which requires no additional hardware modification to existing MRI systems—such as multiple receiver channels or multiple coil control signals—in order to interface with the MRI system and activate the desired coil(s) of the coil system.

SUMMARY OF THE DRAWINGS/FIGURES

DESCRIPTION OF THE PREFERRED EMBODIMENT

Figure 1:
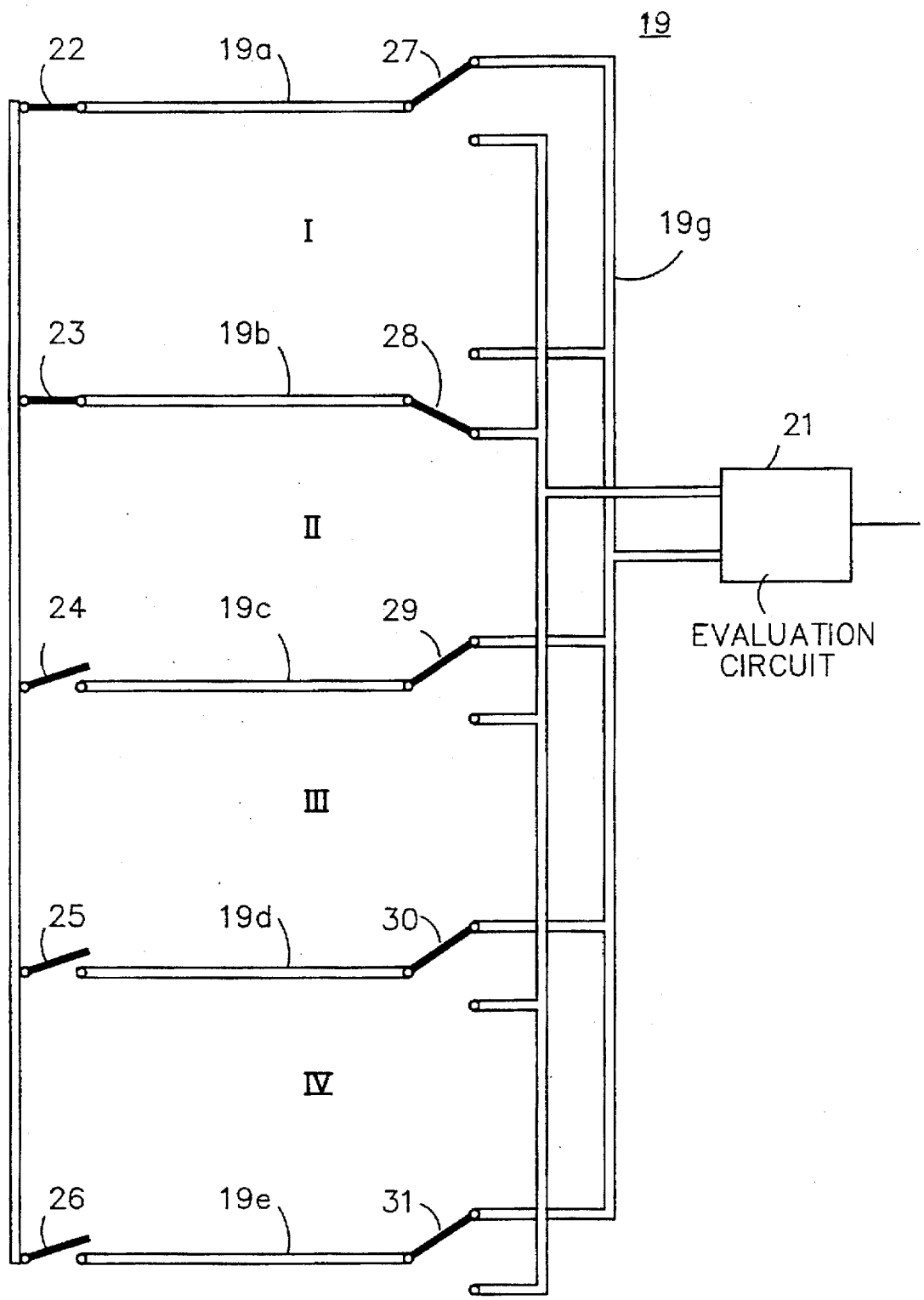
FIG. 1 is a schematic plan of the coil conductor geometry of the prior art.
Figure 2:
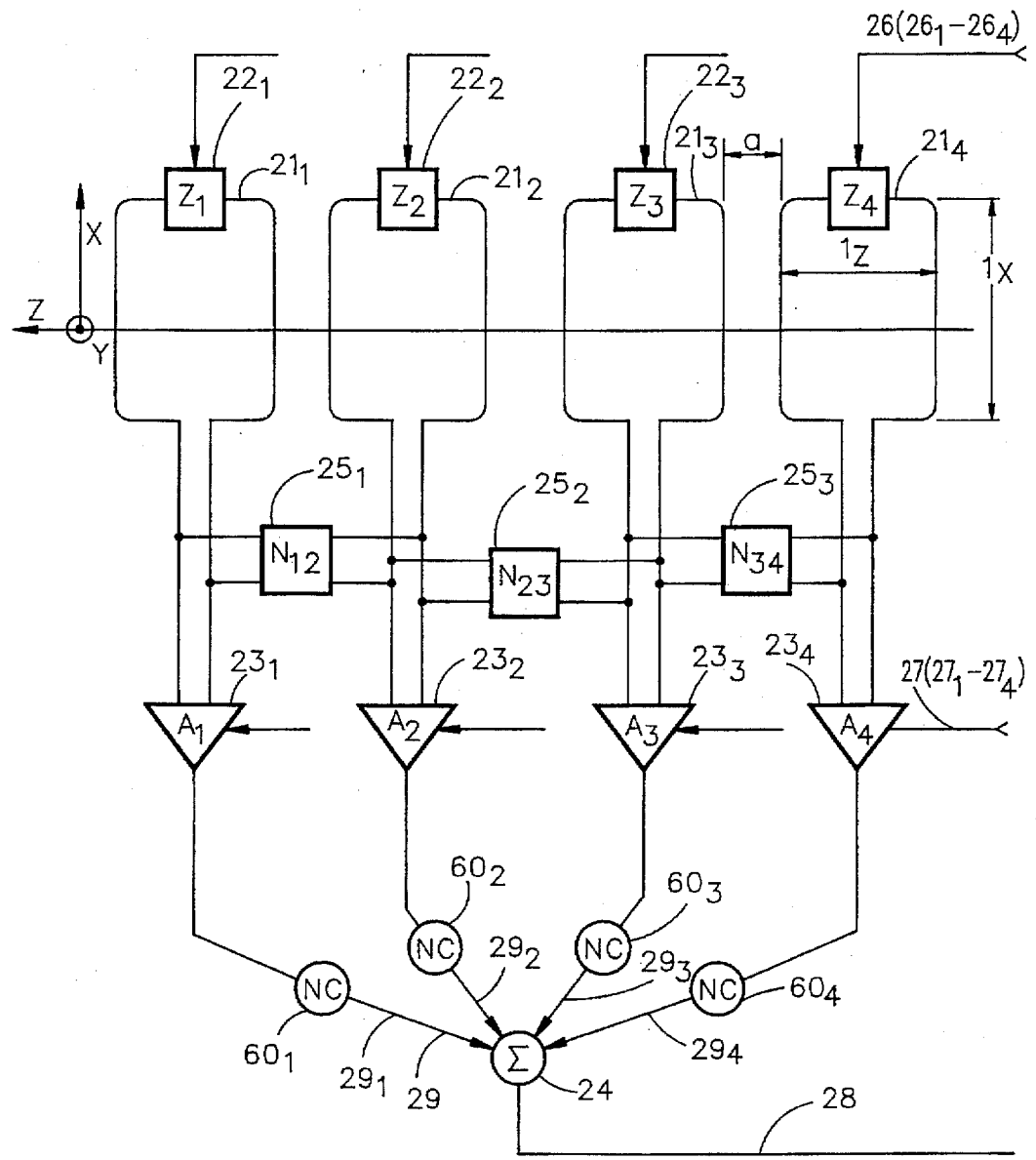
FIG. 2 is a schematic plan of the coil conductor geometry of additional prior art.

Referring now to the drawings, in which similar or corresponding parts are identified with the same reference numeral, and more particularly to FIG. 3, the Surface Coil System for a Single Channel NMR Receiver of the present invention is designated generally at 10 and consists of a plurality of subassemblies (11–20) as described below. The present invention 10 is shown installed in conjunction with a magnetic resonance imaging (MRI) system (dashed lines) with components designated at 1–8. The MRI system shroud 1 is the plastic cover for the front of the hardware representing the magnet, radio frequency body coil, gradient coils and patient entry port 2. The patient gantry 3 supports the patient, the coil system remote receiver/transmitter 16, the multiple-coil assembly 20, and the interconnecting cable 18 which connects 16 and 20. The NMR output of the coil system 10 is connected to the MRI system preamplifier chain at terminal 5 on doghouse assembly 4 via connecting cable assembly 14.

Remote control of the coil system 10 is provided by the control unit 12, and remote key pad 13; both interconnected with cable 11, and installed on or in proximity to the MRI system operator's console 6. The remote control unit preferred embodiment of the invention, contains an electromagnetic (IR) transmitter/receiver which is aimed through the operator's viewing window 7 to communicate with the coil system remote transceiver 16 via the transceiver's optical port 19. This narrow IR beam-width 17 (arrows) communication facilitates the remote selection or activation of certain coil elements within multiple-coil assembly 20. Power is supplied to the control unit 12 via a typical alternating current power cord assembly 15 plugged into the local AC outlet 8.

Multiple-coil assembly 20 is housed in a plastic housing which conforms to the couch top of the patient gantry 3. The multiple coil assembly consists of at least three sets of quadrature detection coils or an array of four to eight individual coil elements. Outputs of the elements or sets of quadrature coils are selected, and added if desired, to yield a single output to the receiver chain of the MRI system.

Figure 4:
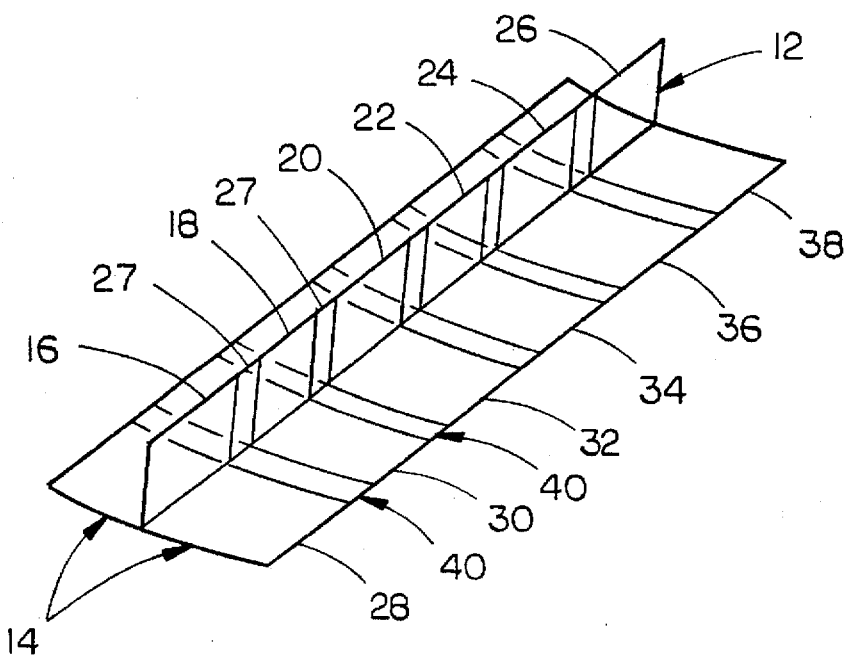
FIG. 4 is a schematic plan of the conductor geometry of prior art.

Referring to FIG. 4, an array of overlapping coils configured for quadrature detection reception of the NMR signals is shown. Each horizontal coil loop is paired with a vertical coil loop to yield quadrature reception (see U.S. Pat. No. 5,430,378) throughout the entire length of the assembly. This assembly yields high SNR throughout the region of both legs of a patient as shown in the prior art. This assembly creates six unique NMR output signals; too many for convenience and reasonable expense in selection and summation.

Figure 6:
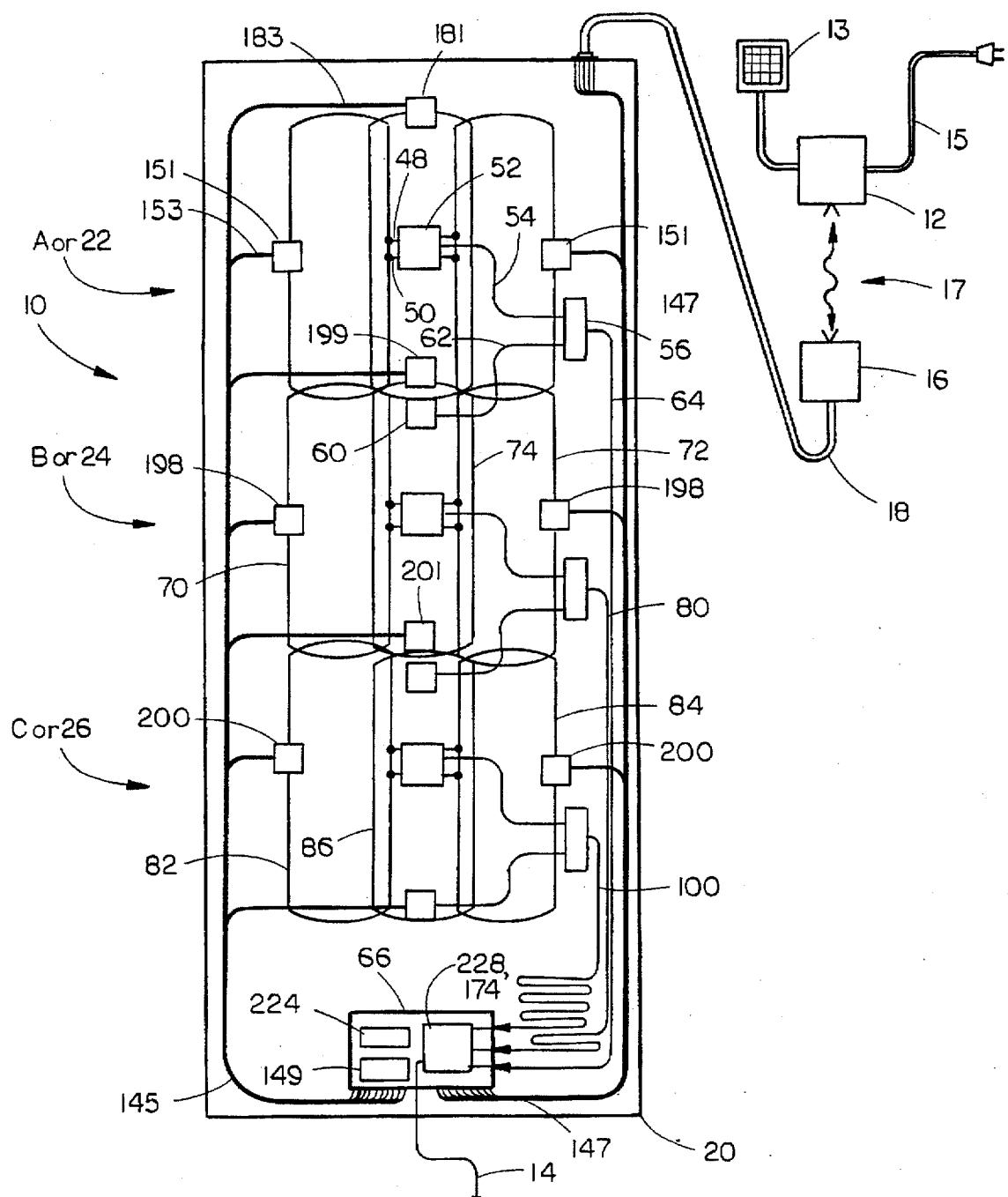
FIG. 6 is a schematic plan of the conductor and circuitry layout of one configuration of the present invention.

Referring now to FIG. 6, an array of overlapping coils with the same general geometrical shape and size as that of the prior art of FIG. 4, each of the three sections 22, 24, and 26 are electronically configured to yield quadrature reception of comparable sensitivity in the same volume as two pairs of the quadrature coils depicted in FIG. 4. This assembly creates three unique NMR outputs from the quadrature combination of each section. This is accomplished by electrically connecting in parallel coil loops 28, 30 and 32 and quadrature combining the NMR signal from this combination of loops with the NMR signal from loop 34. Each of coil loops 28, 30, and 32 have at least one capacitor junction, 36, 38, and 40, respectively, near the center of adjacent parallel conductors, 42, 44, and 46 respectively. Referring to the three axis coordination 48, the first terminal 35, 37, and 39, respectively, of each of these three capacitors 36, 38, and 40 is the terminal in the most positive z location while the second terminal, 41, 43, and 45 respectively is located in a less positive z location. Wire 48 connects the first terminals 35, 37, and 39 and similarly, wire 50 connects the second terminals 41, 43, and 45.

Referring to FIG. 6, wires 48 and 50 form a short transmission line to the impedance matching board 52 where the NMR output signal is transmitted, via a short coaxially transmission line 54, to a quadrature combiner circuit 56. A junction capacitor exists at both ends (with respect to the z axis) of the coil loop 34. The NMR potential developed across the two terminals of capacitor 58 (not shown) on the more positive z end of coil loop 34 is transmitted via impedance matching board 60, and coaxial cable 62 to the combiner 56. Coil loops 28, 30 and 32 contribute one vector component of the transverse NMR signal while coil loop 34 contributes the other (orthogonal) vector component as is understood by those skilled in the art. The quadrature output of the combiner 56 is transmitted via coaxial cable 64 to the input of the RF switching circuit 66.

Referring again to FIG. 5, coil sections 24 and 26 are configured identically as described above for section 22. The outputs of coil sections 24 and 26 are transmitted via coaxial cables 80 and 100 to the RF switching circuit 66.

Figure 7A:
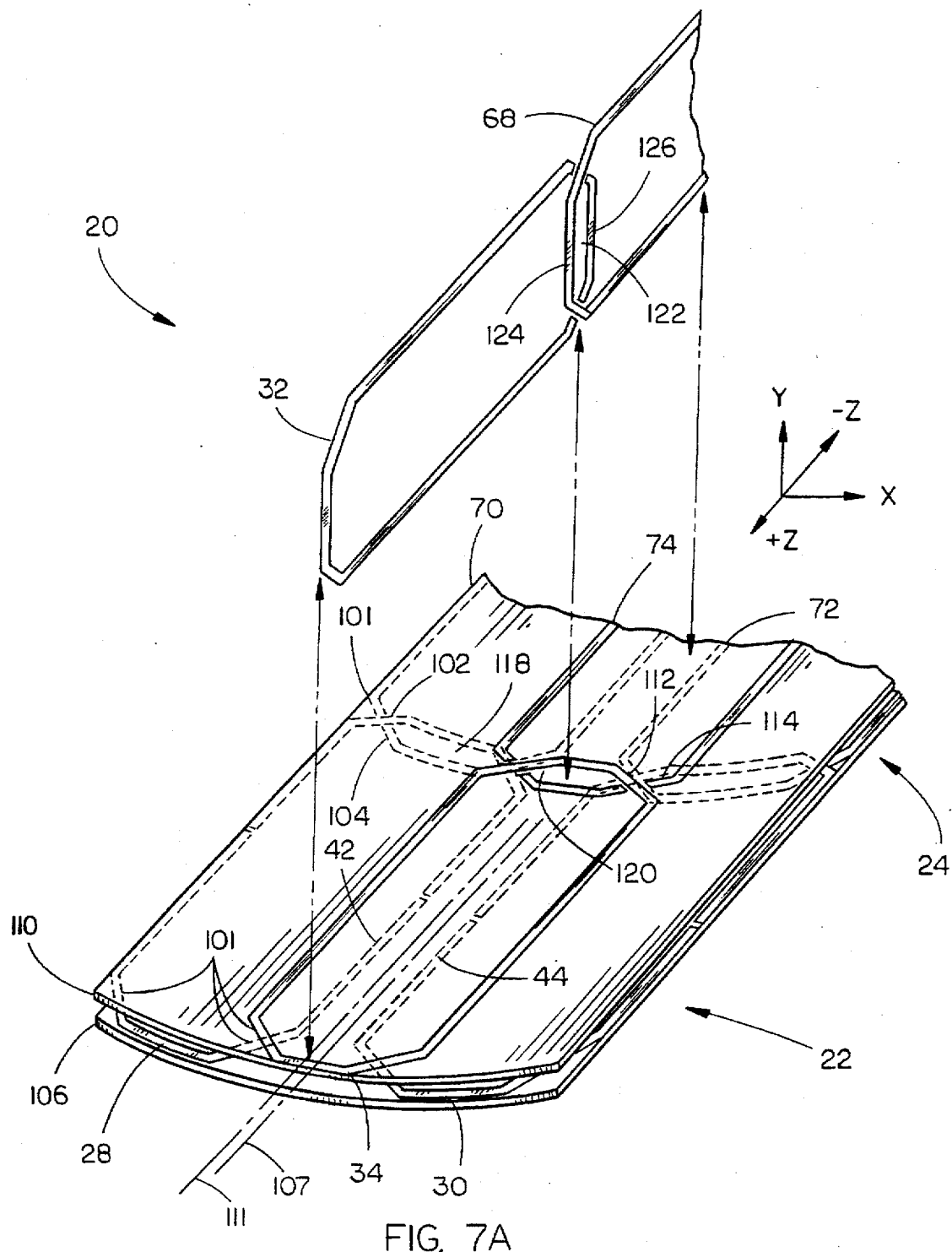
FIG. 7a is a detailed schematic plan of the conductor geometry of the first and second versions of the present invention.
Figure 7B:
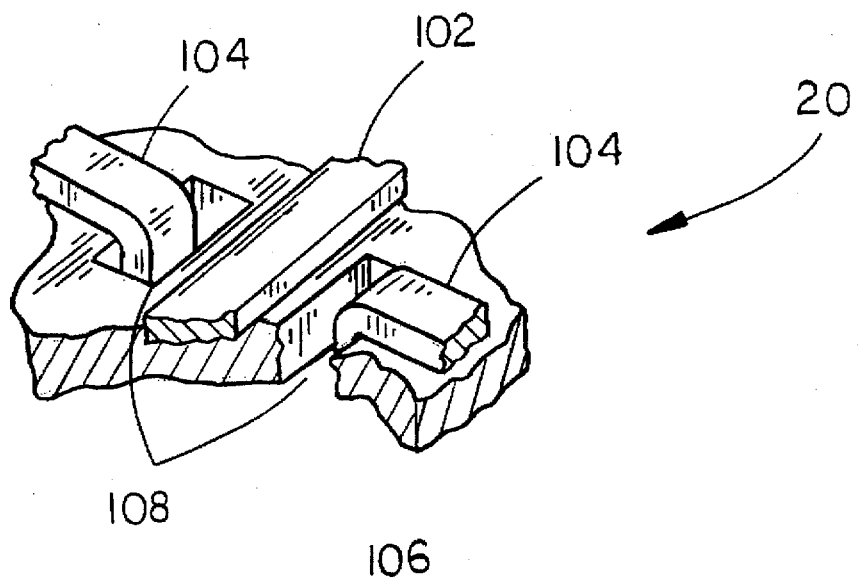
FIG. 7b is an enlargement of a first conductor overlap section of the present invention.
Figure 7C:
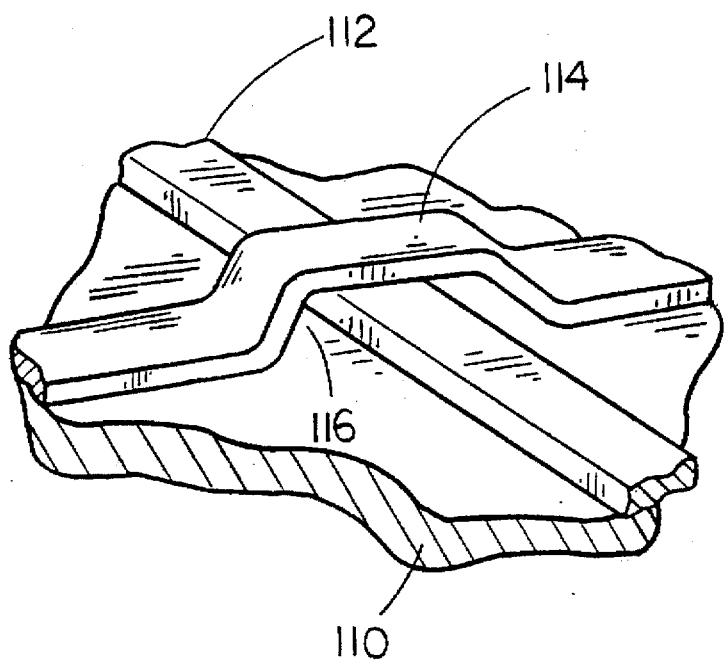
FIG. 7c is an enlargement of a second conductor overlap section of the present invention.

Referring now to FIG. 7, a detailed plan of two possible configurations of the multiple coil assembly 20, construction details necessary for isolation of coil elements is given. Two configurations are derived from this conductor layout. The first configuration is that described briefly above for imaging both legs whereby the legs straddle coil conductor 32, and other vertically opposed conductors, such as 68, while the legs lie above more horizontally opposed conductors such as 28, 30 and 34.

A second embodiment of the invention is to omit the vertically opposed conductor set 32, 68 and similar coils, and utilize only the generally horizontally opposed conductor set 28, 30, and 34, and similar sets such as 70,72, and 74. This would become an overlapping array of quadrature coils useful for imaging the entire spinal process of a patient.

Construction for the purpose of obtaining isolation amongst coil elements is crucial for this invention to operate or for each element to maintain resonant tuning. It is now common knowledge for those skilled in the art to employ a critical overlap between adjacent coil conductors sensitive to the same vector component of the transverse magnetic moment. This condition is not sufficient in of itself when constructing such an array of quadrature coil elements such as coil sections 22, 24, and 26 of FIG. 5. Critical overlap is utilized to compensate for inductive coupling between adjacent coils. Other techniques must be used, in addition to overlap, to minimize or negate the capacitive coupling between quadrature coil pairs. Some of those techniques, well known by those skilled in the art, are as follows: mechanically increasing the distance between conductors of adjacent coils where they overlap, ensuring that the conductors of two adjacent coils cross each other at right angles, and maintaining as large of distance as possible between capacitive junctions of adjoining coils.

Referring again to FIG. 7, construction of the slightly curvilinear, but generally horizontally opposed coil conductor set is as follows. After the general conductor size has been established—with geometrical restrictions, patient coverage considerations, and optimization of the penetration of the coil sensitivity profile accounted for—overlapping arrays of similar linear coil loops are created. Loop pairs 28,30 and 70,72, and 82,84 (shown on FIGS. 5 and 6 only) are created from flattened copper conductor with mitered corners 101 such that when loop pairs overlap, corner conductor segments 102 and 104, of coil loops 28 and 70 respectively, cross each other generally orthogonally. Coil conductors are fabricated onto a semi-flexible non-conductive, non-magnetic, substrate 106. Coil conductors are mounted symmetrically with respect to the x midline 107 of substrate 106. A minimum of 5 mm spacing is maintained between conductors 102 and 104 by routing conductor 104 through parallel directed rectangular holes 108 as shown in the enlarged sketch. The thickness of substrate 106 must either be 5 mm or additional spacers are inserted between conductors 102 and 104 where they cross. This process is repeated at every corner of the every loop which crosses another.

The substrate 106 on which the paired coils (28,30), (70,72), etc. are mounted lies parallel to and underneath another substrate 110 on which coils 34, 74, and 86 (not shown on FIG. 7) are mounted. Mitering of the corners, critical overlap along the z direction, and minimum spacing between overlapping conductors are identically executed as discussed above. Substrate 110 is a minimum of 5 mm thick to minimize capacitive coupling between coil assemblies mounted on substrate 106 and those mounted on substrate 110. Additionally, the routing of mitered conductor 114 protrudes in the opposite y direction as the routing of conductor 104. In lieu of cutting a slot in the mounting substrate such as previously described, a substrate bridge 116 (not shown to reveal conductor path) is inserted to support conductor 114 as it passes over conductor 112. Protruding the overlapping conductors of the two unique coil assemblies, mounted on substrates 106 and 110, in opposite z directions, improves the capacitive isolation between conductor assemblies by increasing spacing between coil loops on the two substrates.

Further, isolation between the upper and lower coil assemblies (mounted on 106 and 110) is achieved by adjusting the lateral (x) position of one assembly 110 with respect to the other assembly 106. As coils 34, 74, and 86 are also mounted symmetrical to the geometric midline 111 of substrate 110, maximum isolation between upper and lower coil assemblies is achieved on or about complete overlap or alignment of the midlines 107 and 111.

One additional coupling component must be addressed in the invention. The predominantly inductive coupling between coil pair 28,30 and pair 70,72 can be nulled with a certain z-directed overlap 118. This overlap 118 will not be identical in length as the z-directed overlap 120 necessary to isolate coil conductors 34 and 74 unless the amount of mitering of the conductor loops is adjusted to compensate for differences in coil geometries and required overlaps.

Hence, the mitering dimension is also crucial to ensure that individual coil components of each quadrature section offer the same coverage along the z direction and maintain isolation from their counterpart in the adjacent coil section. This argument applies to the separate vertically mounted conductor set 32, 68, and 88 (not shown on FIG. 7). The overlap 122 is made identical to overlaps 118 and 120 by adjusting the size of the mitered corners 124 and 126 relative to the size of mitered corner pairs 102,104 and 112, 114.

The aforementioned description of conductor geometries represent two variations of many possible geometries which can be quadrature combined, isolated and selected or deselected in accordance with the length, width and general geometry of the overall examination region of interest.

A further embodiment of the present invention is to substitute a quadrature birdcage coil conductor set for one section 22 of the multiple-conductor set of FIG. 7. Similar isolation adjustment mechanisms are required to isolate the adjacent section 24 from the two vector-sensitive modes of the birdcage coil in section 22.

Figure 8:
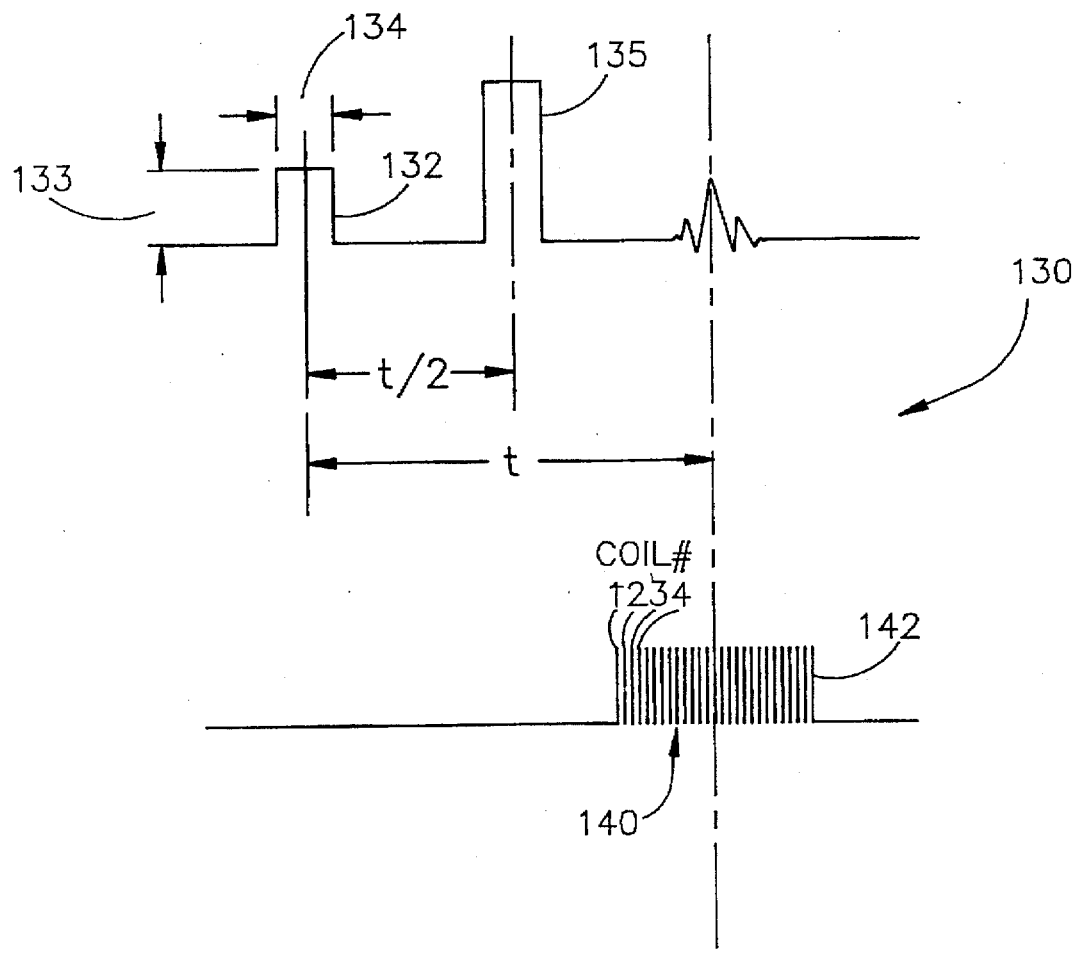
FIG. 8 is a timing diagram of an NMR data acquisition and coil activation or time-multiplexing sequence.

An additional embodiment of this invention is arrays of overlapping coils whose unique RF or NMR outputs are time-multiplexed in the selection board 66 (FIG. 6). Referring to FIG. 8, a timing diagram 130 of NMR acquisition and respective coil activation, time-multiplexing implies that during the NMR data acquisition phase, multiple coil elements are prevented from inductively coupling from one another by not being activated during the same time frame.

A typical Spin Echo NMR pulse sequence is shown where a RF burst 132 of sufficient power (determined by pulse height 133 and duration 134) tips the net magnetic moment (NMM) into the transverse plane—the 90° pulse, 132. As dephasing of the NMM occurs over period t/2, a rephasing pulse 135 inverts the NMM 180° such that the maximum echo 136 or NMR signal occurs at time t. Prior to time t, and for a brief period dependent upon MRI system operator choices, such as receiver bandwidth, a NMR signal sampling interval or window 142 is opened. A single channel receiver would then sample the NMR data during this interval 140, and store and image process it. A time-multiplexed receiver system would sequentially and rapidly activate and deactivate 140 a number of coil elements and then, uniquely store and process the individual receiver coil element's data. The reception by the computer storage device of each element's data would be time synchronized such that each element produced its unique NMR signal to be processed.

This process results in the same benefit of achieving higher SNR from smaller coils, the coverage of a larger coil or group of smaller coils, and doing so with a single channel receiver (in lieu of an expensive multi-channel receiver system).

One drawback of this embodiment is that a synchronizing pulse must be provided by the NMR system to activate the more rapid coil selection-deselection pulses so that the process of time-multiplexed reception can take place within the proper window of time during the acquisition sequence. The disadvantage is only in the complication of the interface of the invention to the NMR system.

Figure 9:
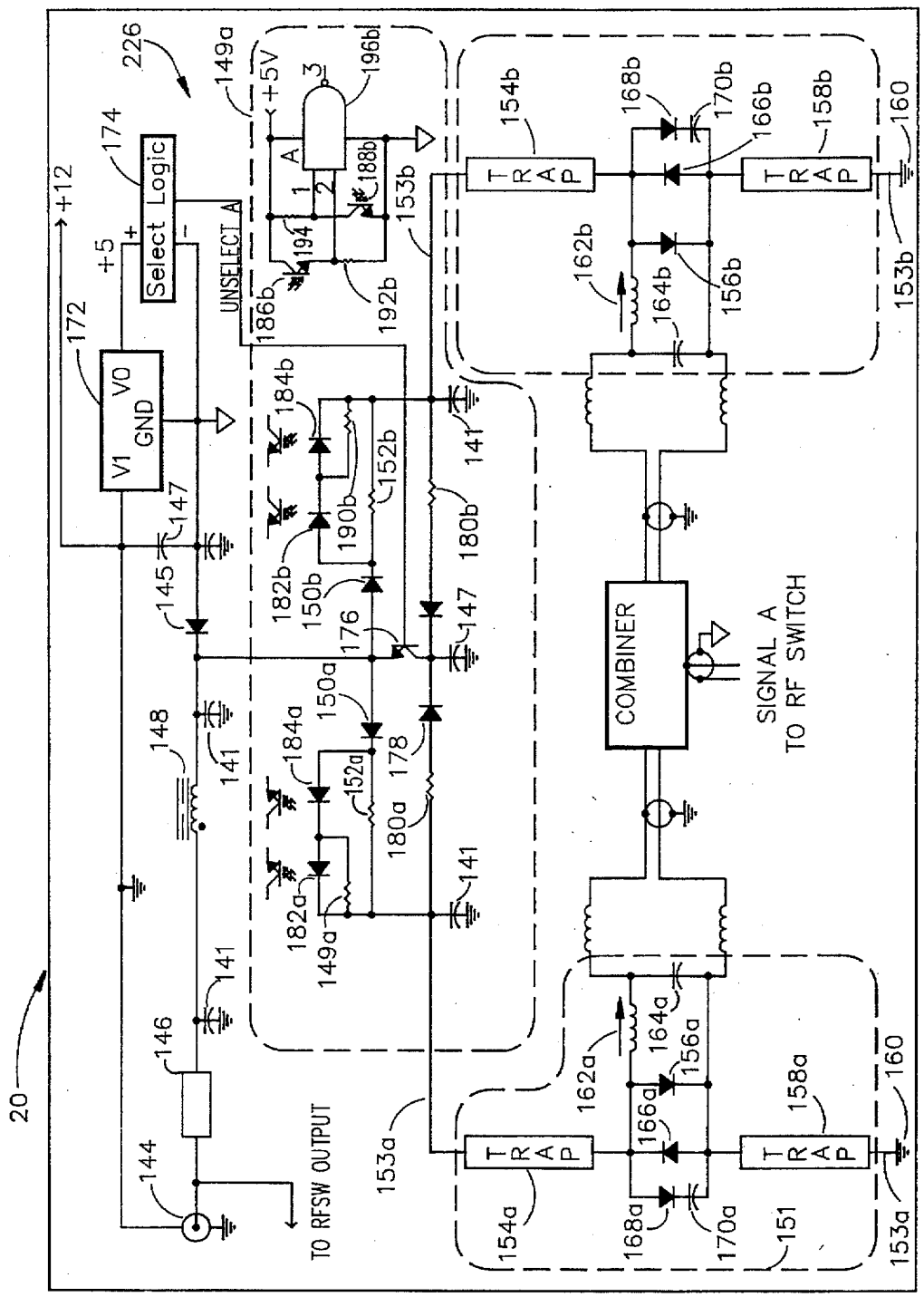
FIG. 9 is a partial schematic of the coil selection and monitoring circuit scheme of the present invention.

Referring to FIG. 9, a partial schematic of the Coil Selection and Monitor Circuit, coil activation and de-activation is achieved by biasing diodes within the decoupling circuitry of the various coil elements of array 20. Two unique sources of biasing currents bias separate diodes on during the transmit and receive cycles of the NMR pulse sequence. Coil elements are detuned when a diode is biased on which is in series with an inductor of the proper value such that the inductive reactance of the inductor equals the capacitive reactance of the coil junction capacitor as is known to those skilled in the art. FIG. 9 is a functional schematic of one quadrature coil section of the present invention showing the method of coil selection during the receive cycle as well as coil detuning during the transmit period. The first source of bias currents is from the NMR system during the transmit phase. This positive going pulse enters the interface connector 144, via the system interconnect 5 and cable 14 (FIG. 3), and proceeds through RF trap 146, RF choke 148, diode 150a resistor 152a, twisted conductor pair 153a, RF trap 154a, PIN diode 156a, and trap 158a to system ground 160. The PIN shorts effectively placing inductor 162 in parallel with coil junction capacitor 164, hence, detuning coil section A. Similarly, current from the positive pulse flows through diode 150b, resistor 152b, twisted pair 153b and traps 154b and 158b, and activates PIN 156b to decouple coil A'. All aforementioned traps, as well as those traps identified hereafter, are comprised of an inductor and capacitor in wired in parallel, as is well known by those skilled in the art, and tuned to the maximum impedance at the frequency which they are to attenuate.

A second current source, generated by a negative pulse of the NMR system and entering through the same path as the positive pulse as discussed above, passes through diode 145 to charge the poser supply capacitor 147. Power supply 172 regulates this voltage to a constant +5 volt supply to the coil select logic 174. The same negative pulse from the NMR system is gated by the coil select logic 174, and transistor 176. Coil select logic biases the base of transistor 176 to either allow or not allow current to flow through the transistor and diode 178a and resistor 180a, via trap 154a and bias on or off diode 166a though trap 158a. Less current is required to maintain adequate coil decoupling during the receive cycle versus during the transmit cycle (due to the lack of strong RF induced currents during the receive cycle), hence a more current efficient diode 166 is employed in conjunction with current limiting resistor 180a. Identical circuitry with identical numerical indicators and suffix b, versus suffix a, provide coil deselect bias to diode 166b of coil A'. Capacitors 141 provide circuit protection by shunting any spurious radio frequency noise spikes to ground.

Current limiting provided by resistors 180a and 180b is necessary as the power supply 172 is capacity limited by the power provided by the NMR system via the interface 144. Diode 168a provides safety redundancy in the event of failure of the biasing scheme or active PIN diode 156a. Diode 168a will fire on as a result of RF voltages being developed across capacitor 164a during the transmit cycle in the event of the PIN not shorting as it is supposed to. Diode 168a and 166a will fire on and off with the cycling RF pulses and prevent large RF voltages or currents from being developed on the coil A during NMR transmit phase. This provides additional safety to the circuitry as well as to the patient lying in close proximity to the coil A. Large RF currents circulating on coil A, such as those which would be present in the event of no coil decoupling, would potentially harm the patient by re-radiation of powerful electromagnetic fields into the proximal patient tissue.

Traps 154a and 158a, PIN 156a, inductor 162a, capacitor 164a, diodes 166a and 168a, and blocking capacitor 170a all comprise a decoupling circuit 151 which detunes coil A. Likewise, components of identical numeration with suffix b comprise a decoupling circuit 181 which detunes the quadrature coil pair to coil A, or coil A'. Coil pair A/A' share a common link to the biasing sources through inductor 148 and transistor 176; hence the coil pair is de-selected and decoupled simultaneously. Twisted conductor pairs 153(a and b) carry the bias from the coil select and monitor circuit 149a to the decoupling circuits 151 and 181 respectfully.

Figure 5:
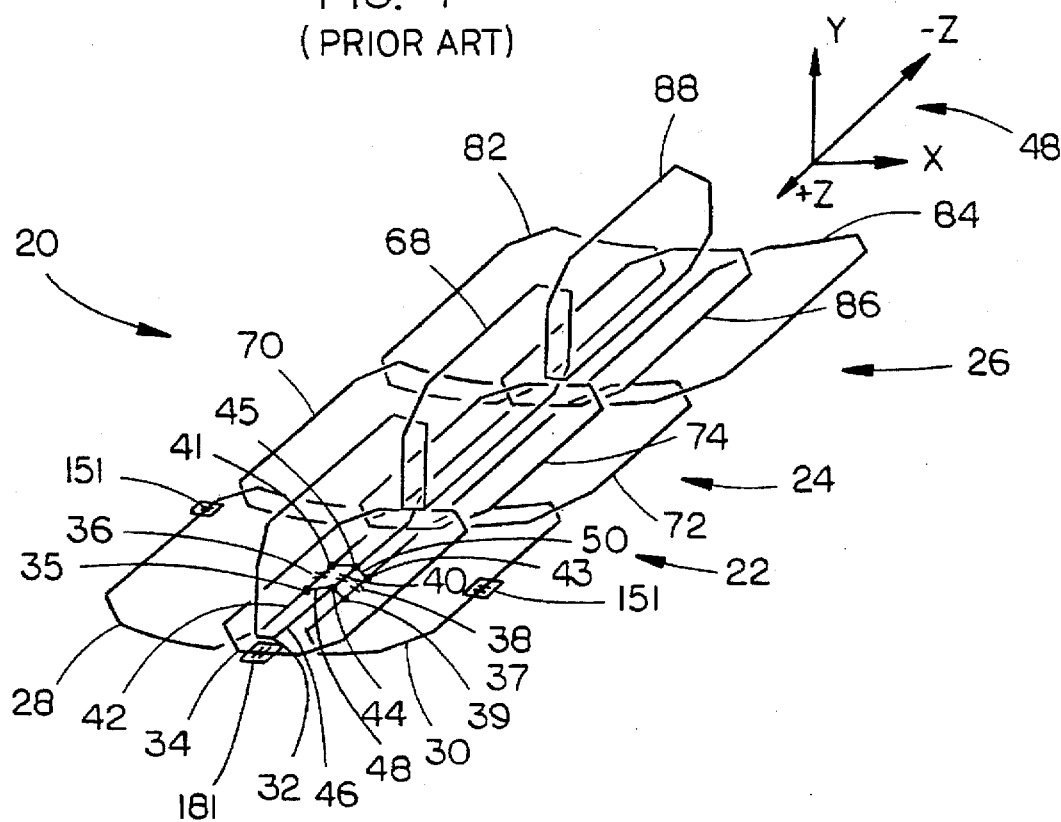
FIG. 5 is a schematic plan of the conductor geometry of one configuration of the present invention.

Referring momentarily to FIG. 6, which omits the vertical conductor section (loops 32, 68, and 88) of FIG. 5—hence creating a coil configuration useful for imaging the human spine, details the placement of decoupling circuits 151, 181, 198, 199, 200, and 201 on coil sections 22, 24, and 26 respectively. Circuits 151 and 181 are shown in place on the coil array 20, section A. Note that circuit 151 is duplicated on each of the lateral sides of section A or coil section 22 of FIG. 5. These decoupling circuits are located at approximately mid section of the outer or lateral conductors of coil loops 28 and 30 (and loop 32 if utilized) of section 22. Circuit 181 is located on the most positive z end of loop 34. Decoupling circuit pairs 198 and 200 (FIG. 6) connect to loops 70 and 72 of coil section B or 24 and loops 82 and 84 or coil section C or 26, respectively, in identical fashion as circuit pair 151 connects to coil section A or 22. Circuits 199 and 201 are identical to circuit 181 and connect to loops 74 and 86 respectively, in identical fashion as circuit 181 connects to loop 34.

Circuit 149a (FIG. 9) is unique to each of the three or more coil sections of FIGS. 5 and 6, and provides diode biases to the decoupling circuits of only one coil section. A three section coil as shown in FIG. 5 or 6 will have two additional circuits identical to circuit 149a; 149b, and 149c as well, and one or more circuit 151 and 181 per section. Twisted pair conductors 153(a and b) and 183(a and b), each containing a return conductor tied to chassis or system ground 160, are amongst the similar conductor pairs comprising cable trunks 145 and 147. Twisted pairs 153(a and b) and 183(a and b) connect the selection circuit 149a, mounted on board 66, to the decoupling circuits 151, 181, respectively. Similar pairs connect similar selection circuitry 149b and 149c outputs to the remaining decoupling circuits (FIG. 6; 198, 199, 200, and 201) in identical fashion.

Referring again to FIG. 3, Control Unit 12 is the remote link to the coil array 20. This unit provides for remote selection of RF signals from the various coil antenna elements within the coil array 20, as well as provides remote activation and de-activation of the coil elements of array 20. A two-way communication exists between control unit 12 and coil array 20 via transceiver unit 16. After transceiver unit 16 receives the communication from control unit 12, unit 16 output is sent via cable 18 to coil array 20 for coil selection and RF switching. The condition of coil array 20 is monitored and re-transmitted via cable 18 and transceiver 16 to control unit 12 as discussed below.

Figure 10:
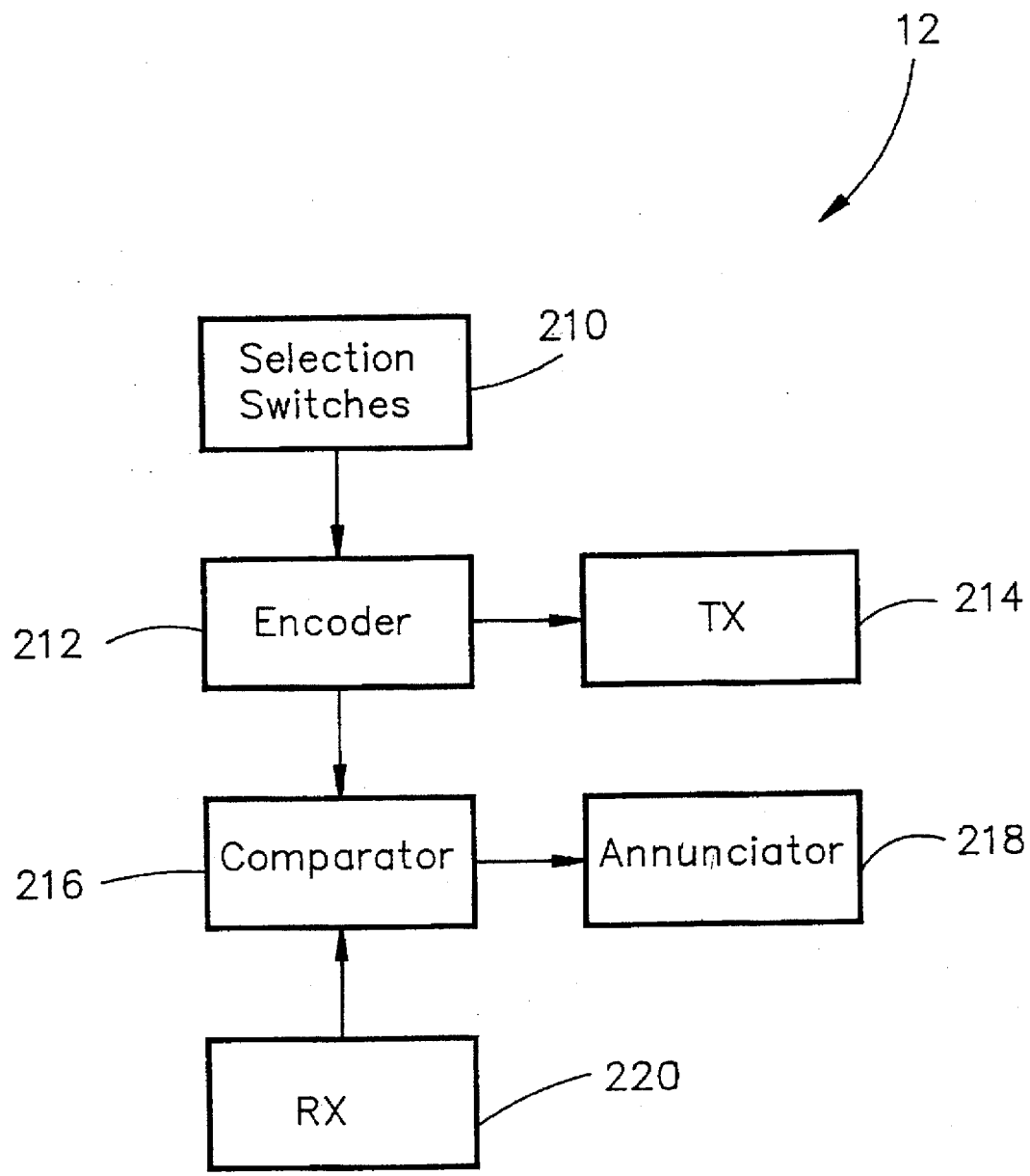
FIG. 10 is a block diagram of the control unit of the present invention.

Referring now to FIG. 10, the electronic block diagram of Control Unit 12 consists of a plurality of functional circuits including: selection switches 210, encoder circuit 212, infrared transmitter 214, comparator circuit 216, annunciator 218, and IR receiver circuit 220. The electronic push-button selection switches 210 which, when pushed at the appropriate time, send a decimal-coded logic state to the encoder circuit 212. Encoder circuit 212 contains a clock and timing circuit which converts the decimal code to binary-coded decimal for storage and comparison 216, and for additional conversion to a series of IR pulses. The IR pulses are transmitted via a limited-beam-IR transmitter 214 to the receiver unit 16 of coil array 20 (FIG. 3).

Figure 11:
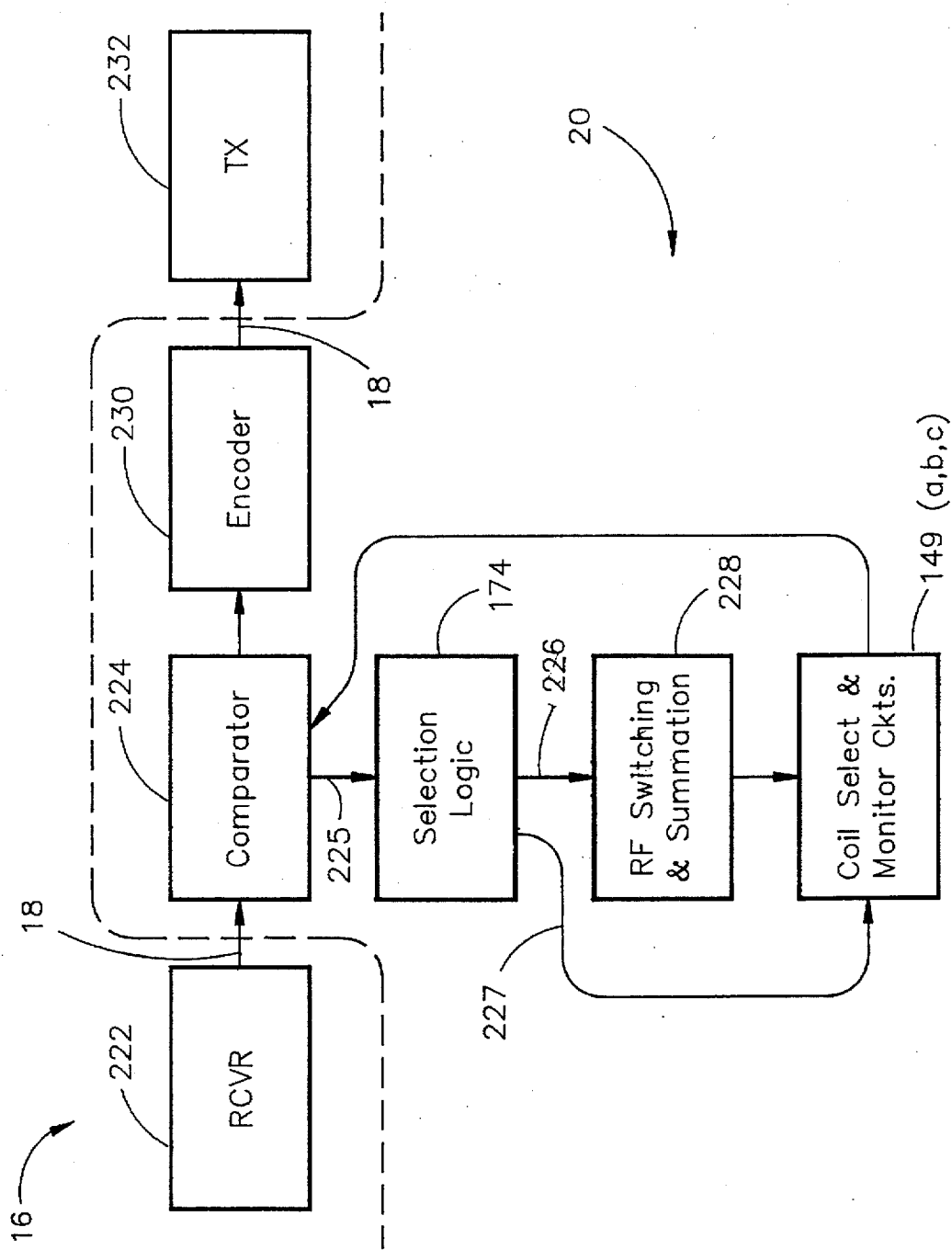
FIG. 11 is a block diagram of the transceiver unit and coil array of the present invention.

Referring to FIG. 11, a block diagram of the transceiver unit 16 and coil array 20, the receiver unit 222 (of transceiver 16) detects and transforms the IR pulses to a BCD logic for comparison to itself in the comparator 224. Two series of IR pulses are consecutively transmitted and received, then compared, to minimize possible data corruption in the communication path. If the two sets of data are not identical, the comparator will not activate the coil selection logic 174 to change the coil selection. If the data is confirmed in the comparator, the output 225 of the comparator 224 is clocked into the selection logic 174 for conversion to coil selection logic states, outputs 227, and RF switch 228 activation logic states, outputs 226. These logic outputs 226 and 227, either in TTL or CMOS form, are responsible for driving electronically controlled switches (solid state relays) 228 and for gating decoupling PIN diode biases in the coil selection and monitoring circuitry 149 (a,b,and c) respectively, of the coil array 20.

Referring again to FIG. 6, RF switching circuitry 228 selects one or more of the coil sections' (22,24, or 26) RF outputs, on cables 64, 80, or 100, and routes it (them) via cable 14 to the MRI system. Simultaneously, the unwanted outputs (of 64, 80, and 100) are deselected, and their origin or source coil is decoupled or detuned due to the biasing outputs from the coil selection circuitry 149 (FIGS. 9 and 11). RF signals from two or more of the coil sections can be combined to accommodate larger fields-of-view of patient anatomy. This is accomplished by activation and selection of two or more coils and their respective signal outputs. Signal combination is accomplished in the RF switching board, part of board 66, and the added signal is selected with the RF switches 228 (FIGS. 6 and 11), via separate and unique switching logic states, in lieu of any single signal or logic state. While the desired signal, whether individual or combined coil output, is passed through to the RF input 5 of the MRI system with very little attenuation (<1 db), the unwanted coil outputs, signal or noise, are prevented from adding to the common output by the use of particularly good quality RF switches. This quality is also measured in db of isolation or attenuation, and is>30 db in the "open" condition.

A coil decoupling diode monitoring circuit for coil A' is depicted by the following components: optical diodes 182b and 184b, optical transistors 186b and 188b, bias resistors 190b, 192b, and 194b; and logic gate 196b. During the positive-going system pulse, current flows through diode 150b and resistor 152b as previously discussed. Part of the current through diode 150b is shared between resistor 152b and diodes 182b, 184b, and resistor 190b. Optical coupling exists between diodes 182b and 184b, and optical transistors 186b and 188b respectively. Depending upon the condition of PIN diode 156b, different currents will flow through these optical devices and create different logic conditions upon the input pins of gate 196b. Resistors 190b, 192b, and 194b are sized such that the logic conditions vary according to the following condition of PIN 156b. If the PIN is conducting as normal (with approximately 50 mA), diode 182 emits sufficient light to bias on transistor 186b placing a logic high on pin 2 of gate 196b. During this condition, insufficient current flows through diode 184b to cause it to emit light; therefore, transistor 188b is biased off. This places a logic high on pin 1 of gate 196b; hence, gate 196b is enabled and a logic low is present at pin 3 of the gate.

If either monitoring diode 156b or 166b is shorted, excess current flows through the monitor diodes 182b and 184b. This biases on transistors 186b and 188b and creates a logic high on pin 3 of gate 196b. Similarly, if diode 156b is open, insufficient current flows to cause either monitor diodes to emit light. This also results in deactivation of the gate 196b creating a logic high on pin 3.

An identical circuit with identical numerical indicators is partially shown for coil A. Similar monitoring circuitry, of circuits 149(a,b, and c) exists for all coil sections. The outputs such as that of pin 3 of gate 196b are muted to encoder 230 (FIG. 11) for encoding and IR transmission, via transmitter 232, to the control unit 12 (FIG. 10) for processing and fault detection in the comparator 216 and fault indication in the annunciator 218.

Figure 3:
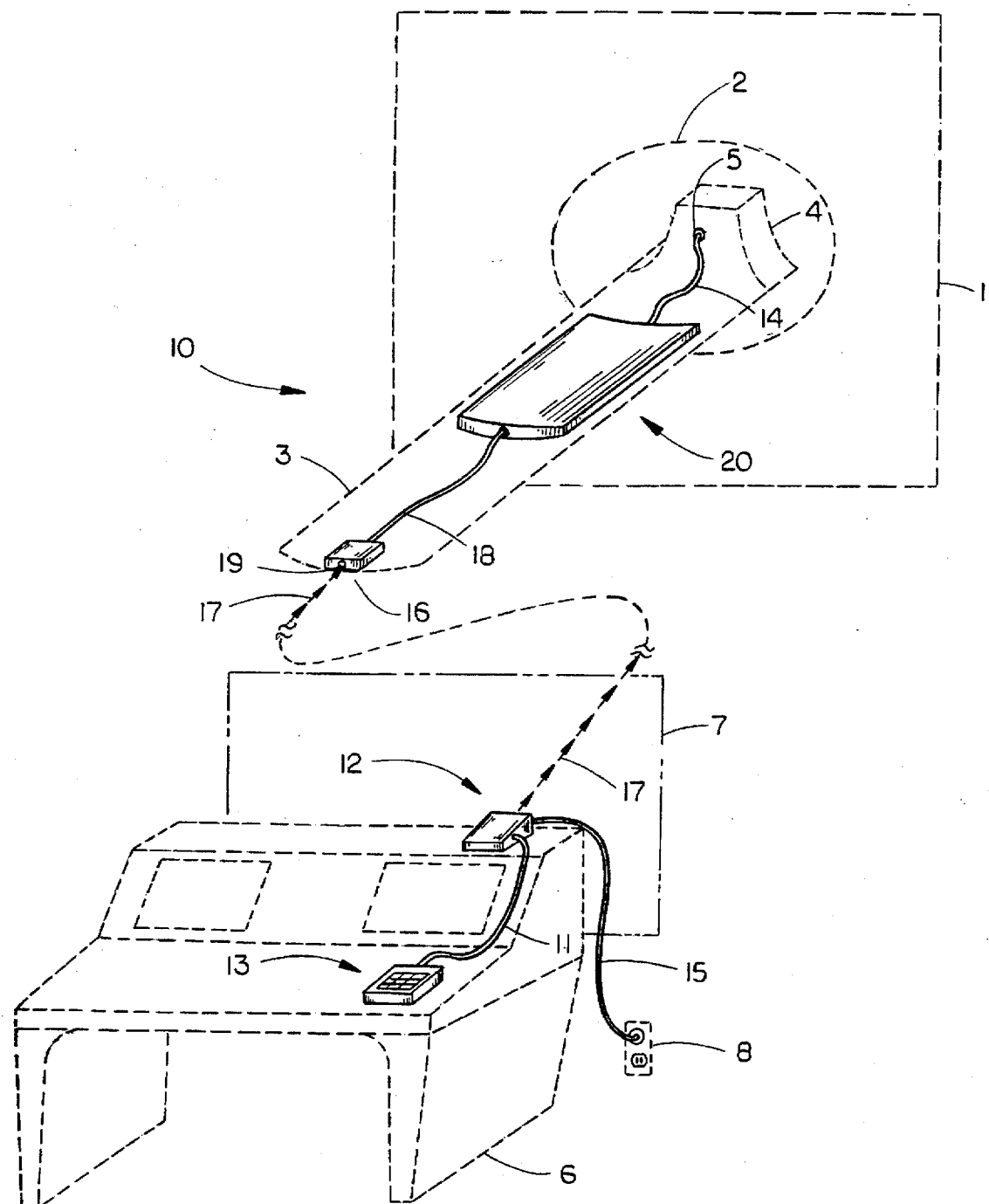
FIG. 3 is a schematic plan of the surface coil system of the present invention shown in conjunction with one configuration of nuclear magnetic resonance apparatus to which the system will interface.

Referring momentarily to FIGS. 3, 10 and 11, the communication between control unit 12 and coil 20 is a closed loop system whereby the IR code sent by the control unit 12 is received by transceiver 19, where it is decoded (224 of FIG. 11) and used for activation/deselection (174, 149 a,b,c of FIG. 11) of coil sections, compared to the monitoring circuit logic (149 a,b,c of FIG. 11) code, re-encoded and re-transmitted 19 (230 and 232 of FIG. 11) to be received by receiver 220 (FIG. 10) of control unit 12. If a decoupling diode is faulty, the re-transmitted code from transmitter 236 of coil transceiver 16 is different than the code received by transceiver 16. Upon reception of this code by receiver 220 of control unit 12 (FIG. 10), comparator 216 will activate the annunciator circuit 218 to sound an audible alarm and light a warning light to call attention to the system operator that their is a faulty circuit. The time required for this closed loop communication to occur is less than 2 seconds. Further, a binary coded decimal code is numerically and visually indicated by a lighted segment indicator (part of 218, FIG. 10) on control unit 12 to indicate the location and fault condition of the coil 20. Detection of a fault condition will prevent the continued operation of the coil system 10 until such condition has been cleared. A reset button on the control unit 12 will clear a fault due to interruption of the communication such as a physical disruption of the IR path, but a faulty diode condition will prevent selection of coil sections, and hence, further operation of the coil system 10.

Whereas the invention has been shown and described in connection with the preferred embodiments thereof, it will be understood that many modifications, substitutions and additions may be made which are within the intended broad scope of the appended claims. There has therefore been shown and described an improved SURFACE COIL SYSTEM FOR A SINGLE CHANNEL MRI RECEIVER which accomplishes at least all of the above stated objects.

We claim:

1. A surface coil system for single channel MRI reception comprising:

a coil system including a plurality of self-resonant, overlapping coil conductor sections arranged relative to one another and to anatomical regions of a patient such that a combination of regions form a desired larger region of interest;

each of said coil sections including a plurality of coil conductor elements, each said coil element activatable to generate a MRI output signal;

a control unit located remotely from said coil system and in electromagnetic communication therewith, having means for selectively electronically activating and deactivating each of said coil sections to cause the coil elements within each section to produce MRI output signals when activated;

said control unit including means for broadcasting an electromagnetic signal through space to the coil system, and said coil system including means for receiving said electromagnetic signal from said control unit;

said coil system including means for broadcasting an electromagnetic signal through space to the control unit, and the control unit including means for receiving said electromagnetic signal from the coil system;

said broadcasting and receiving means in the control unit and coil system enabling wireless electromagnetic communication therebetween; and said coil system including means for combining selected MRI output signals;

and means for electrically connecting said coil system to an MRI system to transmit said combined signals to the MRI system.

2. The surface coil system of claim 1, wherein said plurality of coil conductor elements encompass a surface area having a width along a transverse axis and a length along a longitudinal axis of an MRI system, said conductor elements each providing a unique MRI output voltage signal received from patient tissue regions geometrically adjacent to the respective conductor elements, said regions defining a region of sensitivity of each conductor element.

3. The surface coil system of claim 2, wherein each coil element is oriented relative to an adjacent coil element so as to inductively isolate said adjacent coil elements.

4. The surface coil system of claim 1, wherein each coil conductor loop includes: a capacitor in series with an inductive element to form a resonant geometric closed loop;

wherein said MRI system includes an acquisition cycle having a transmit portion and a receive portion; and wherein said means for selectively activating and deactivating each of said coil sections includes means for deactivating each coil element during the transmit portion of the MRI system acquisition cycle, and means for selectively deactivating selected coil elements during the receive portion of the MRI system acquisition cycle.

5. The surface coil system of claim 4, wherein said means for selective activating and deactivating said coil sections includes:

a plurality of PIN diodes in series with a plurality of inductors, a set of diodes and inductors connected in parallel with at least one coil loop capacitor, said set of diodes and inductors electrically sized such that the total reactance of the inductors and diodes in the conductive state is equal to and cancels the reactance of the parallel capacitors;

a plurality of fast acting, low threshold switching diodes connected in parallel with and having opposite polarity as said PIN diodes; and electrical means utilizing synchronized direct current pulses from said MRI system to bias decoupling circuitry of the coil elements during the MRI system transmit portion.

6. The surface coil system of claim 1, wherein said control unit includes:

a key pad with a plurality of push buttons electrically connected to a control circuit;

said control circuit including transceiver means for transmitting and receiving encoded electromagnetic signals, and including means for transmitting independent signals responsive to selection of a key pad push button to activate selected coil loops;

a second transceiver electrically connected to the coil system and located to transmit and receive encoded electromagnetic signals to and from said control unit transceiver;

said control circuit including an encoder circuit for encoding signals from the control key pad as transmission signals;

said coil system transceiver including a decoder and selection logic circuit, for decoding signals from the control unit transceiver and selecting coil elements for resonance;

said coil system including an RF switching circuit for selecting an MRI signal from said coil sections;

said coil system further including an encoding circuit for translating logic signals from the selection logic circuit and encoding electromagnetic transmissions from said second transceiver for transmission to the control unit transceiver; and said coil system further including a system monitor circuit for detecting open and shorted decoupling diodes and providing logic signal outputs to said encoder circuit;

said circuit means gating the MRI system bias source for selectively biasing diodes of opposite polarity during the MRI system receive portion.

7. The surface coil system of claim 6, wherein said coil system further includes a system monitor circuit for detecting open and shorted decoupling diodes and providing logic signal outputs to said encoder circuit.

8. The surface coil system of claim 1, wherein said means for combining selected MRI output signals includes means for the controlled phase-shifted addition of an input signal from each of two coil sections resulting in a summation signal output.

9. The surface coil system of claim 6, wherein said control unit and said coil system transceivers further include comparator circuitry for comparing sets of transmitted pulses to prevent spurious and erroneous transmission.

10. The surface coil system of claim 6, further comprising means for detecting coil section selection and for visually indicating coil section selection.

11. The surface control system of claim 10, further comprising alarm means for detecting coil system diode failures and interruptions in transmission signals, and for activating audible and visual alarms in the event of such miscommunication.

12. The surface coil system of claim 6, wherein said decoder and selection logic circuit further includes means for driving said RF switching circuitry.

13. The surface coil system of claim 6, wherein said RF switching circuit includes at least two solid state RF switches for selecting signals from said coils, and for routing an operator-selected coil section output to at least one signal combiner.

14. A surface coil system for single channel MRI reception comprising:

a coil system including a plurality of self resonant, overlapping quadrature coil conductor sections arranged relative to one another and to anatomical regions of a patient such that a combination of regions formed a desired region of interest;

each of said coil sections including a pair of self resonant coil conductor loops arranged in quadrature;

means for electronically combining signals generated by each coil loop of each quadrature coil pair to form a unique region of sensitivity;

a control unit located remotely from said coil system and operably connected thereto, having means for selectively electronically activating and deactivating each of said coil sections to cause the coil loops within each section to produce MRI output signals when activated;

said coil system including means for combining selected MRI output signals; and means for electrically connecting said coil system to a MRI system to transmit said combined signals to the MRI system.

15. The surface coil system of claim 14, wherein each said quadrature coil section includes:

a first coil mounted on a thin non-conductive generally planar substrate within a generally planar horizontal housing;

said first coil substrate and housing having forward and rearward longitudinal ends, and opposing transverse side edges located equidistant from a longitudinal midline;

said first coil including two generally rectangular loop conductors lying symmetrically left and right of said midline and extending equidistant laterally between midline and the transverse side edges;

said rectangular loop conductors having at least a 0.25 inch gap formed therein at the longitudinal midpoint along a conductor segment oriented parallel and adjacent the midline, creating two endpoints on each side of said gap, for each rectangular loop;

said endpoints, at identical longitudinal coordinates, of each pair of generally rectangular loops being connected with electrically conductive material to form a single, closed loop, wider horizontal coil from said rectangular loop conductors;

said wider horizontal coil having outer parallel conductor segments parallel to the conductor segments having the gap therein;

a second coil mounted on a second generally horizontal thin non-conductive generally planar substrate and enclosed within said housing;

said second coil formed of a conductor with generally rectangular shape, extending longitudinally and symmetrically centered about said longitudinal midline, with parallel outer conductor segments located a transverse distance from said midline less than the transverse distance of the wider horizontal coil outer segments, to form a narrower closed loop horizontal coil;

said wider horizontal coil being oriented with its longitudinal length aligned with the longitudinal length of said narrower horizontal coil, to form a quadrature coil pair.

16. The surface coil system of claim 15, further comprising a second quadrature coil pair having a wider horizontal coil mounted on said first substrate and a narrower horizontal coil mounted on the second substrate, said wider and narrower horizontal coils being located relative to one another to inhibit inductive coupling between adjacent coils and between adjacent quadrature pairs.

17. The surface coil system of claim 14, wherein each said quadrature coil section includes:

a first coil mounted on a thin non-conductive generally planar horizontal housing;

said horizontal coil substrate and housing having forward and rearward longitudinal ends, and opposing transverse side edges located equidistant from a longitudinal midline;

said first coil including two generally rectangular loop conductors lying symmetrically left and right of said midline and extending equidistantly laterally between midline and the transverse side edges;

said rectangular loop conductors having at least a 0.25 inch gap formed therein at the longitudinal midpoint along an inner conductor segment oriented parallel and adjacent the midline, creating two endpoints, on each side of said gap, for each rectangular loop;

said endpoints, at identical longitudinal coordinates, of each pair of generally rectangular loops being connected with electrically conductor material to form a single closed loop wider horizontal coil from said rectangular pair.

18. The surface coil system of claim 17, further comprising a second quadrature coil pair comprised of a wider horizontal coil on the first substrate, a second vertical coil on said vertical substrate, and a narrower horizontal coil on said second horizontal substrate, said wider coils, narrower coils and vertical coils, all located relative to one another so as to inhibit inductive coupling between adjacent coils and between adjacent quadrature pairs.

19. A surface coil system for single channel MRI reception comprising:

a coil system including a plurality of self-resonant, overlapping coil conductor sections arranged relative to one another and to anatomical regions of a patient such that a combination of regions form a desired larger region of interest;

each of said coil sections including at least one coil conductor elements for generating MRI signal voltages upon activation thereof;

a control unit located remotely from said coil system and electromagnetically communicating therewith, having means for selectively electronically activating and deactivating each of said coil sections to cause the coil loops within each section to produce MRI output signals when activated;

wherein said MRI system includes an acquisition cycle having a transmit portion and a receive portion;

a time-multiplexing circuit for synchronously activating coil sections and sampling their MRI outputs; and means for electrically connecting said coil system to an MRI system to transmit said combined MRI output signals to the MRI system.

20. The surface coil system of claim 19, wherein said coil system includes:

means for time synchronously activating and deactivating each of said coil sections and gating the respective coil section MRI output signals during the receive portion of the MRI acquisition cycle;

said coil outputs being synchronously received and digitally stored by the MRI system for later image construction;

a keypad with a plurality of push buttons electrically connected to a control circuit;

said control circuit including transceiver means for transmitting and receiving encoded electromagnetic signals, and including means for transmitting independent signals responsive to selection of a key pad push button to activate selected coil loops;

a second electromagnetic transceiver electrically connected to the coil system and located to transmit and receive encoded electromagnetic signals to and from said control unit transceiver;

said control circuit including an encoder circuit for encoding signals from the control key pad as transmission signals;

said coil system transceiver including a decoder and selection logic circuit, for decoding signals from the control unit transceiver and selecting coil elements for resonance;

said coil system including an RF switching circuit for selecting an MRI signal from said coil sections;

said coil system further including an encoding circuit for translating logic signals from the selection logic circuit and encoding electromagnetic transmissions from said second transceiver for transmission to the control unit transceiver.

* * * * *